(12) United States Patent
Zhu et al.

(10) Patent No.: US 11,901,608 B2
(45) Date of Patent: Feb. 13, 2024

(54) CHIP-PACKAGE-ANTENNA INTEGRATED STRUCTURE BASED ON SUBSTRATE INTEGRATED WAVEGUIDE (SIW) MULTI-FEED NETWORK

(71) Applicant: 38TH RESEARCH INSTITUTE, CHINA ELECTRONICS TECHNOLOGY GROUP CORPORATION, Anhui (CN)

(72) Inventors: Chuanming Zhu, Anhui (CN); Zongming Duan, Anhui (CN); Yuefei Dai, Anhui (CN)

(73) Assignee: 38TH RESEARCH INSTITUTE, CHINA ELECTRONICS TECHNOLOGY GROUP CORPORATION, Hefei (CN)

( * ) Notice: Subject to any disclaimer, the term of this patent is extended or adjusted under 35 U.S.C. 154(b) by 262 days.

(21) Appl. No.: 17/206,378

(22) Filed: Mar. 19, 2021

(65) Prior Publication Data
US 2022/0247065 A1 Aug. 4, 2022

(30) Foreign Application Priority Data
Jan. 29, 2021 (CN) .......................... 202110127056.3

(51) Int. Cl.
*H01Q 1/22* (2006.01)
*H01L 23/66* (2006.01)
*H01L 23/00* (2006.01)

(52) U.S. Cl.
CPC .......... *H01Q 1/2283* (2013.01); *H01L 23/66* (2013.01); *H01L 24/16* (2013.01);
(Continued)

(58) Field of Classification Search
CPC ... H01Q 1/2283; H01L 23/5389; H01L 23/66; H01L 2223/6655; H01L 29/41741;
(Continued)

(56) References Cited

U.S. PATENT DOCUMENTS

| 11,539,107 B2* | 12/2022 | Lim | ........................ H01P 3/082 |
| 2011/0285475 A1* | 11/2011 | Lu | ............................ H04B 1/48 |
| | | | 333/104 |

(Continued)

FOREIGN PATENT DOCUMENTS

| CN | 101496298 A | 7/2009 |
| CN | 111342224 A | 6/2020 |

(Continued)

*Primary Examiner* — Younes Boulghassoul
*Assistant Examiner* — Quinton A Brasfield

(57) ABSTRACT

A chip-package-antenna integrated structure based on an SIW multi-feed network. A plurality of output terminals of the chip are connected to the SIW multi-feed network through the impedance matching network, to achieve the impedance matching between the chip and the SIW multi-feed network. The output terminal of the SIW multi-feed network is directly connected to the antenna terminals, and two or more input signals experience power combining in the substrate integrated waveguide are combined for power combining. Then the combined millimeter-wave signal is radiated by the antenna, finally realizing the power combining in the chip-package-antenna integrated structure. At the same time, the SIW multi-feed network is composed of a SIW structure, in which a plurality of via holes are arranged spaced apart to form a cavity structure.

9 Claims, 7 Drawing Sheets

(52) U.S. Cl.
CPC ................. *H01L 2223/6655* (2013.01); *H01L 2223/6677* (2013.01); *H01L 2224/16227* (2013.01)

(58) Field of Classification Search
CPC ............. H01L 25/16; H01L 2223/6677; H01L 2223/6616; H01L 2223/6627
See application file for complete search history.

(56) References Cited

U.S. PATENT DOCUMENTS

| | | | | |
|---|---|---|---|---|
| 2015/0221600 A1* | 8/2015 | Wakabayashi | ...... | H01L 23/5384 257/664 |
| 2019/0207286 A1* | 7/2019 | Moallem | .............. | H01Q 1/2283 |
| 2023/0352807 A1* | 11/2023 | Zhang | .................... | H05K 1/025 |

FOREIGN PATENT DOCUMENTS

| | | | | |
|---|---|---|---|---|
| CN | 112106256 A | * | 12/2020 | ........... G01S 13/931 |
| CN | 212209736 U | | 12/2020 | |
| EP | 3414791 A1 | * | 12/2018 | ........... H01Q 1/2283 |

* cited by examiner

CHIP-PACKAGE-ANTENNA INTEGRATED STRUCTURE BASED ON SUBSTRATE INTEGRATED WAVEGUIDE (SIW) MULTI-FEED NETWORK

CROSS-REFERENCE TO RELATED APPLICATIONS

This application claims the benefit of priority from Chinese Patent Application No. 202110127056.3, filed on Jan. 29, 2021. The content of the aforementioned application, including any intervening amendments thereto, is incorporated herein by reference in its entirety.

TECHNICAL FIELD

The present application relates to package of millimeter-wave chip, and more particularly to a chip-package-antenna integrated structure based on substrate integrated waveguide (SIW) multi-feed network.

BACKGROUND

By transmitting electromagnetic wave signals and detecting the reflected echo signals, the radar can determine the velocity and distance of a target object in time. In the millimeter-wave frequency band, due to the smaller operating wavelength, the small-sized antennas have a significant advantage when applied in automotive radars, security inspection radars, and gesture recognition smart devices.

Traditionally, in order to increase the detection distance of the target object, the power at an output end of the millimeter-wave chip is increased or the antennas are arrayed to increase a gain of the antenna, thereby increasing the equivalent isotropically radiated power (EIRP) of the system. For example, a power combiner is currently adopted to achieve power combining.

However, the planar power divider has a small quality factor, and the impedance ratio on the power divider will increase as the number of input ports increases, thereby affecting its performance.

SUMMARY

An object of this disclosure is to provide a chip-package-antenna integrated structure based on substrate integrated waveguide (SIW) multi-feed network to solve the problem in the prior art that the existing chip-package-antenna integrated structure has poor power amplification performance based on a planar power divider.

To achieve the above object, the technical solutions of the present disclosure are described as follows.

The present disclosure provides a chip-package-antenna integrated structure based on SIW multi-feed network, comprising:
  a chip;
  an impedance matching network;
  the SIW multi-feed network; and
  an antenna;
  wherein the chip is a packaged chip;
  the impedance matching network connects a plurality of output terminals of the chip to a plurality of input terminals of the SIW multi-feed network correspondingly, to achieve an impedance matching between the chip and the SIW multi-feed network; and the SIW multi-feed network is configured for power combining, and the SIW multi-feed network comprises an output terminal connected to the antenna.

In an embodiment, the chip comprises a plurality of on-chip transformers in one-to-one correspondence with transmission channels, and the plurality of on-chip transformers are connected to a pad of the chip.

In an embodiment, the impedance matching network is connected to the pad through ball grid array (BGA), via hole or wire bonding.

In an embodiment, the chip is packaged by flip-chip, fan-out, wire bonding, low temperature co-fired ceramic (LTCC) or high density interconnect (HDI).

In an embodiment, the impedance matching network adopts a grounded coplanar waveguide (GCPW) transmission line.

In an embodiment, a short-circuited stub is provided in a middle of the GCPW transmission line to eliminate a capacitance effect.

In an embodiment, the plurality of input terminals and the output terminal of the SIW multi-feed network are both arranged on a cavity composed of two rows of via holes.

In an embodiment, the antenna is patch antenna, Yagi antenna, dipole antenna, Vivaladi antenna, slot antenna or horn antenna, or an array thereof.

In an embodiment, the impedance matching network, the SIW multi-feed network and the antenna are all arranged on an upper surface of a dielectric slab, and are respectively connected to a metal ground on a lower surface of the dielectric slab through via holes.

Compared to the prior art, the disclosure has the following beneficial effects.

In the chip-package-antenna integrated structure provided herein, a plurality of output terminals of the chip are connected to the SIW multi-feed network through the impedance matching network to achieve the impedance matching between the chip and the SIW multi-feed network. The output terminal of the SIW multi-feed network is directly connected to the antenna terminals, and two or more input signals experience power combining in the substrate integrated waveguide. Then the combined millimeter-wave signal is radiated by the antenna, finally realizing the power combining in the chip-package-antenna integrated structure. At the same time, the SIW multi-feed network is composed of a SIW structure, in which a plurality of via holes are arranged spaced apart to form a cavity structure, to ensure that the SIW structure is approximately equivalent to the waveguide structure. As a consequence, compared to the traditional planar power divider, the SIW structure has a higher quality factor and larger power capacity, thereby improving the EIRP of the system.

BRIEF DESCRIPTION OF THE DRAWINGS

The disclosure will be described in detail below with reference to the accompanying drawings and embodiments to make the technical solutions of the disclosure clearer. Obviously, presented in the accompanying drawings are only some embodiments of the disclosure, which are not intended to limit the disclosure. Other embodiments obtained by those of ordinary skill in the art based on the content of the disclosure without sparing any creative effect should fall within the scope of the disclosure.

DETAILED DESCRIPTION OF EMBODIMENTS

Figure 1:
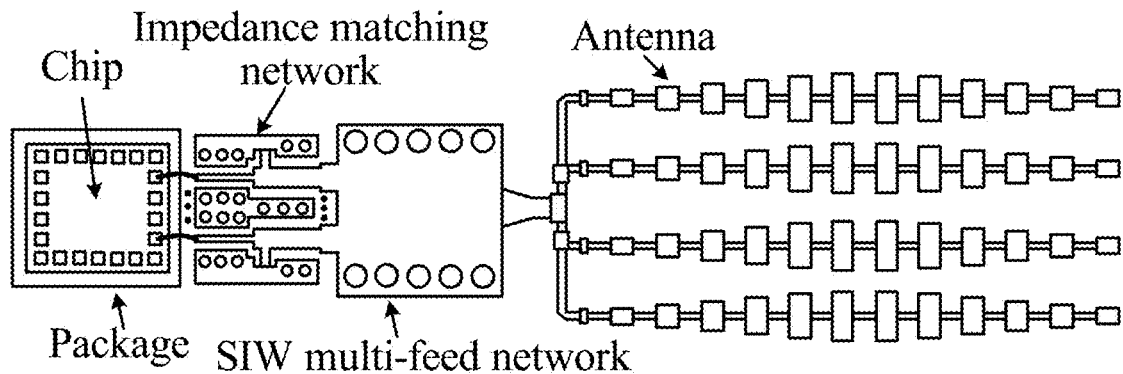
FIG. 1 is a top view of a chip-package-antenna integrated structure based on substrate integrated waveguide (SIW) multi-feed network according to an embodiment of the present disclosure.
}

The disclosure will be described clearly and completely below with reference to the embodiments to make the object, technical solutions, and advantages of the present disclosure clearer. Obviously, presented below are merely some embodiments of the present disclosure, and are not intended to limit the disclosure. Other embodiments obtained by those of ordinary skill in the art based on the content disclosed herein without sparing any creative effort shall fall within the scope of the present disclosure.

Provided below is a chip-package-antenna integrated structure based on substrate integrated waveguide (SIW) multi-feed network, to solve the problem of poor power amplification performance in the existing chip-package-antenna integrated structure based on a planar power divider.

The design concept of the technical solutions of the disclosure is described as follows.

In order to achieve the power combining, a plurality of output terminals of the chip are connected to a substrate integrated waveguide (SIW) multi-feed network through a matching network, and the output terminal of the SIW multi-feed network is directly connected to the antenna. Then the multiplexed millimeter-wave signal is radiated by the antenna. As a consequence, the disclosure solves the problems of small quality factor, large loss, large size, small bandwidth and lower power capacity in traditional planar power dividers.

The disclosure will be described below with reference to the accompanying drawings and embodiments to facilitate the understanding of the above technical solutions.

Embodiment 1

Provided herein is a chip-package-antenna integrated structure based on SIW multi-feed network, including a chip, an impedance matching network, the SIW multi-feed network and an antenna.

The chip is a packaged chip.

The impedance matching network connects a plurality of output terminals of the chip correspondingly to a plurality of input terminals of the SIW multi-feed network to realize the impedance matching between the chip and the SIW multi-feed network.

The SIW multi-feed network is provided for power combining, and the SIW multi-feed network includes an output terminal connected to the antenna.

Compared to the prior art, the embodiment has the following beneficial effects.

In the chip-package-antenna integrated structure provided herein, a plurality of output terminals of the chip are connected to the SIW multi-feed network through the impedance matching network, to achieve the impedance matching between the chip and the SIW multi-feed network. The output terminal of the SIW multi-feed network is directly connected to the antenna terminals, and two or more input signals experience power combining in the substrate integrated waveguide. Then the combined millimeter-wave signal is radiated by the antenna, finally realizing the power combining on the chip-package-antenna integrated structure. At the same time, the SIW multi-feed network is composed of a SIW structure, in which a plurality of via holes are arranged spaced apart to form a cavity structure, to ensure that the SIW structure is approximately equivalent to the waveguide structure. As a consequence, compared to the traditional planar power divider, the SIW structure has a higher quality factor and larger power capacity, thereby improving the EIRP of the system.

The embodiment will be described in detail below.

As shown in FIG. 1, the present disclosure provides a chip-package-antenna integrated structure based on a substrate integrated waveguide (SIW) multi-feed network, including a chip, an impedance matching network, the SIW multi-feed network and an antenna.

Figure 2:
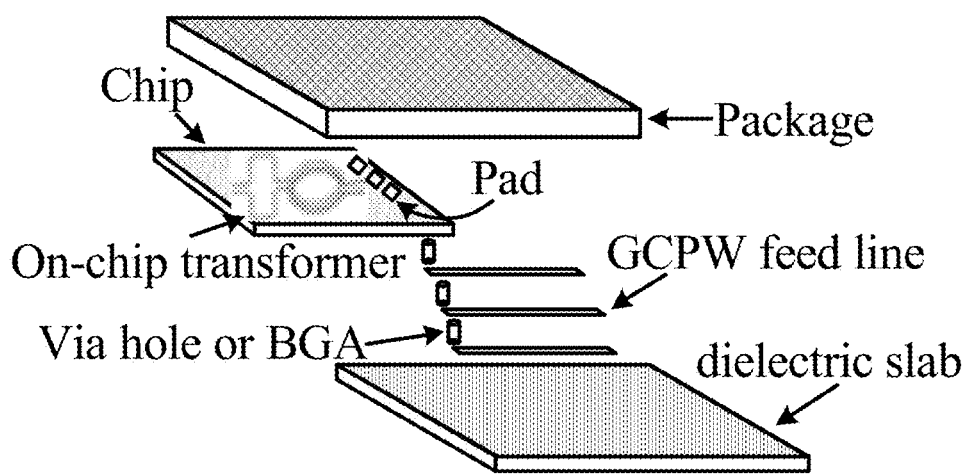
FIG. 2 schematically shows connections of a chip, an on-chip transformer, and a GCPW feeder line according to an embodiment of the present disclosure.

The chip can be packaged by flip-chip, fan-out, wire bonding, low temperature co-fired ceramic (LTCC) or high-density interconnect (HDI). Referring to FIG. 2, the chip includes a plurality of on-chip transformers, and each on-chip transformer corresponds to a transmission channel of the chip. The on-chip transformers are connected to a pad of the chip.

Figure 3:
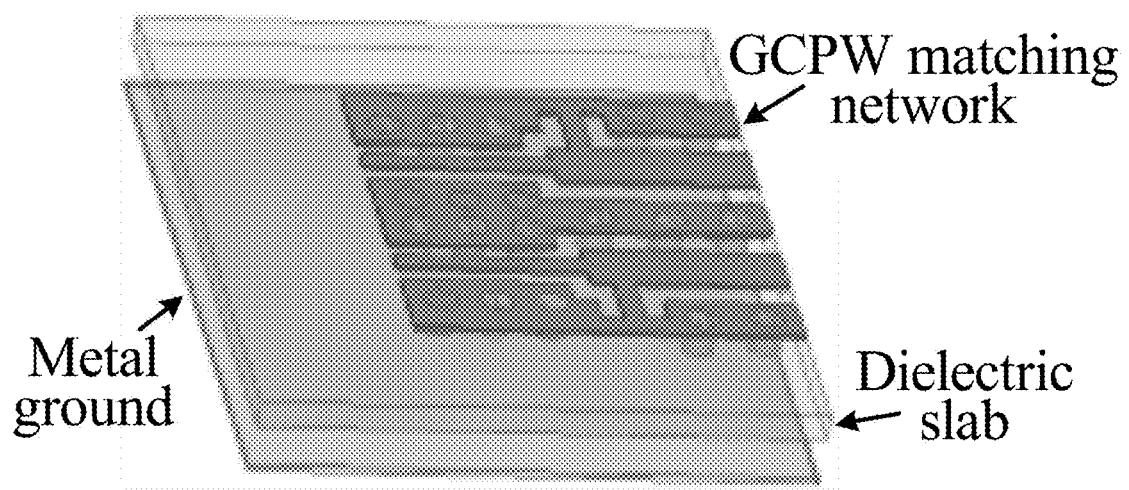
FIG. 3 is a perspective view of a GCPW impedance matching network according to an embodiment of the present disclosure.

As shown in FIG. 3, the impedance matching network adopts a grounded coplanar waveguide (GCPW) transmission line, to realize the transition between the matching chip and the SIW multi-feed network. The plurality of input terminals of the impedance matching network are connected to the plurality of emission channels of the chip in a one-to-one correspondence, that is, the impedance matching network is connected to the pad of the chip through ball grid array (BGA), via hole or wire bonding. A short-circuited stub is provided in a middle of the GCPW transmission line to eliminate a capacitance effect caused by the coupling between the package and the impedance matching network.

Figure 4:
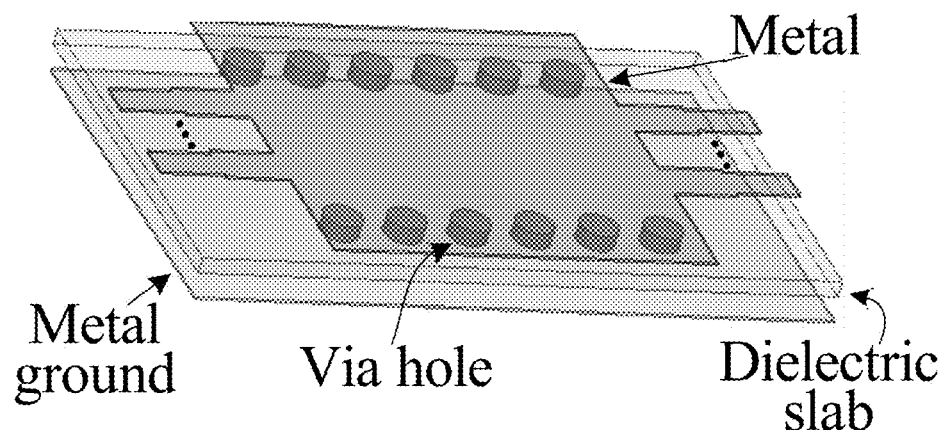
FIG. 4 is a perspective view of the SIW multi-feed network according to an embodiment of the present disclosure.

As shown in FIG. 4, The SIW multi-feed network is composed of a substrate integrated waveguide (SIW) structure, including a plurality of input terminals connected to an impedance matching network and at least one output terminal connected to an antenna. A plurality of via holes in the SIW multi-feed network are arranged spaced apart to form a cavity structure. The plurality of input terminals and the at least one output terminal of the SIW multi-feed network are both arranged on a same cavity composed of two rows of via holes, to ensure that the SIW structure is approximately equivalent to the waveguide structure. Compared to a traditional planar power divider, the SIW structure in the embodiment has a higher quality factor and a larger power capacity. The plurality of output terminals of the chip is transited through the impedance matching network, and then connected to the input terminal of the SIW multi-feed network, so that two or more input signals experience power combining in the substrate integrated waveguide. In addition, the transition between the SIW structure and the plurality of input terminals does not require a large impedance transformation, thus, compared to the traditional power divider, it has a wider working bandwidth. Moreover, the SIW multi-feed network in the embodiment can effectively reduce the volume and cost of the system, and improve the EIRP of the system.

Figure 5:
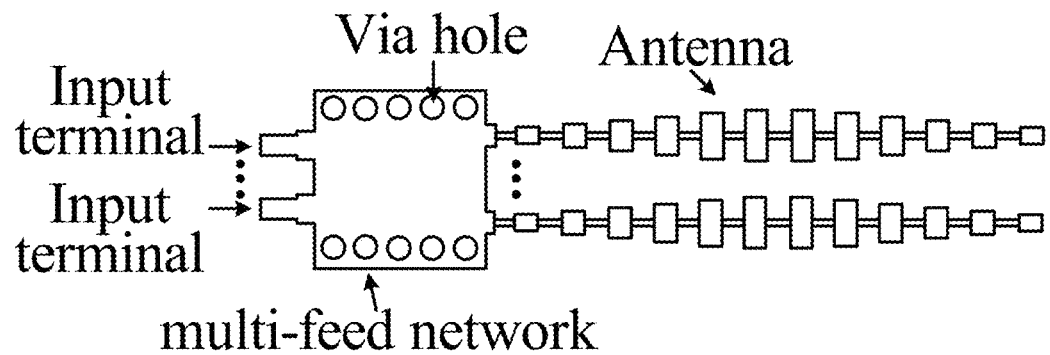
FIG. 5 schematically depicts connection between the SIW multi-feed network and a plurality of antennas according to an embodiment of the present disclosure.
Figure 6:
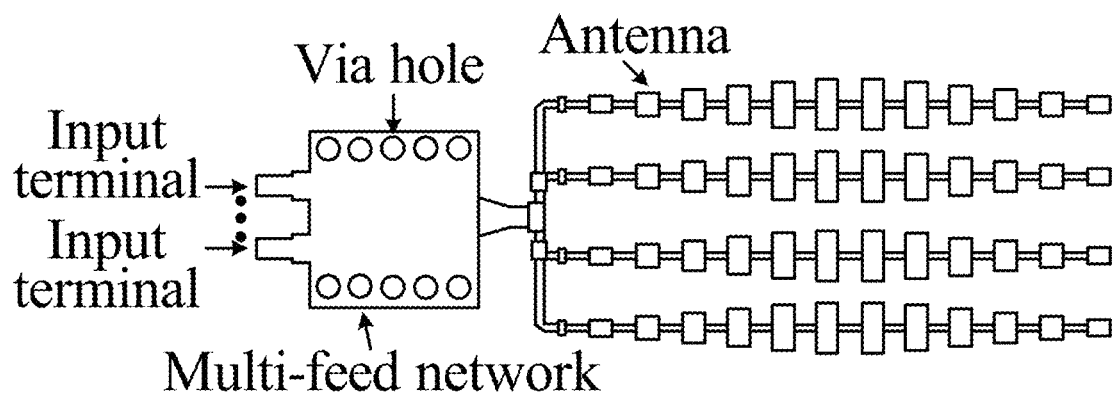
FIG. 6 schematically depicts connection between the SIW multi-feed network and an antenna array according to an embodiment of the present disclosure.

The antenna is patch antenna, Yagi antenna, dipole antenna, Vivaladi antenna, slot antenna or horn antenna, or an array thereof. For example, an antenna array composed of multiple antennas, and a scenario that the SIW multi-feed network is connected to multiple antennas or an antenna array as shown in FIGS. 5-6. The antenna is directly connected to the output terminal of the SIW multi-feed network, and the multiplexed millimeter wave signal is radiated by the antenna.

Figure 7:
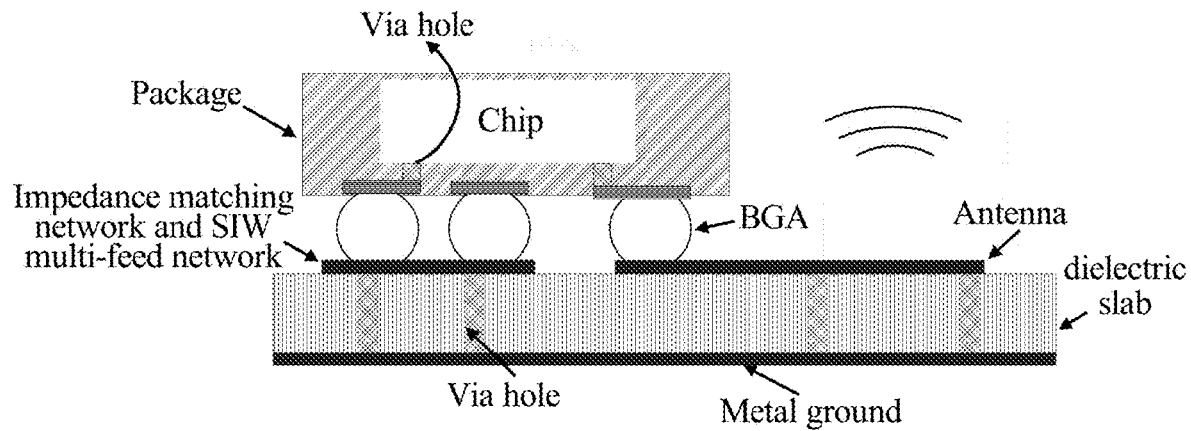
FIG. 7 schematically depicts positions of the impedance matching network, the SIW multi-feed network, and the antenna according to an embodiment of the present disclosure.

As shown in FIG. 7, the impedance matching network, the SIW multi-feed network and the antenna are all arranged on an upper surface of a dielectric slab, and are connected to a metal ground on a lower surface of the dielectric slab through a via hole.

Figure 8:
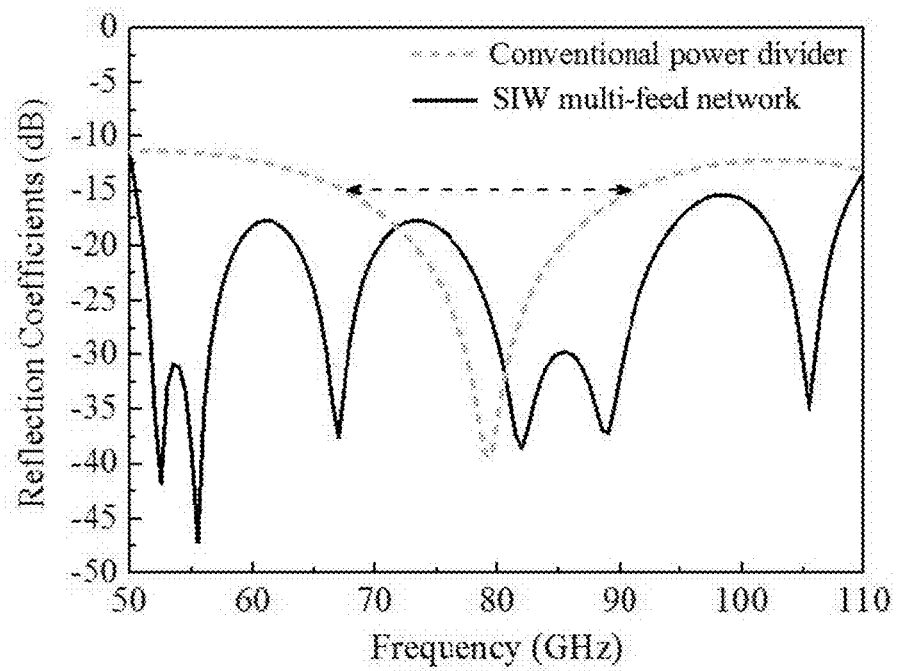
FIG. 8 schematically illustrates comparison between reflection coefficients of the traditional two-way Wilkinson power divider and an SIW dual-feed network according to an embodiment of the present disclosure.

A comparison between the traditional two-way Wilkinson power divider and the SIW dual-feed network in this embodiment in reflection coefficient is shown in FIG. 8, from which it can be observed that the traditional power divider has only one pole in the band, and its 15 dB absolute bandwidth is only 23 GHz; while the SIW dual-feed network has 6 poles in the band, and its 15 dB absolute bandwidth is close to 60 GHz.

Figure 9:
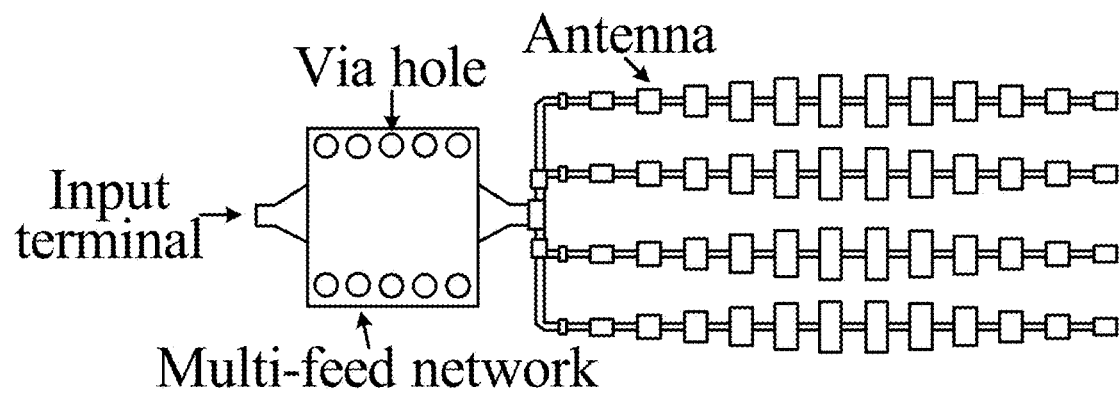
FIG. 9 is a top view of an antenna based on SIW single-feed network according to an embodiment of the present disclosure.
Figure 10:
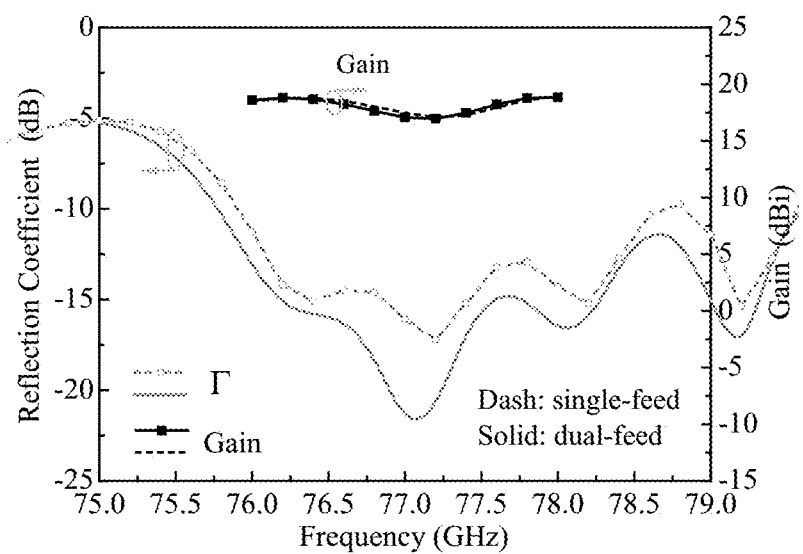
FIG. 10 schematically illustrates comparison of the antenna based on the SIW single-feed network and the antenna based on the SIW dual-feed network in the matching and gain according to an embodiment of the present disclosure.
Figure 11:
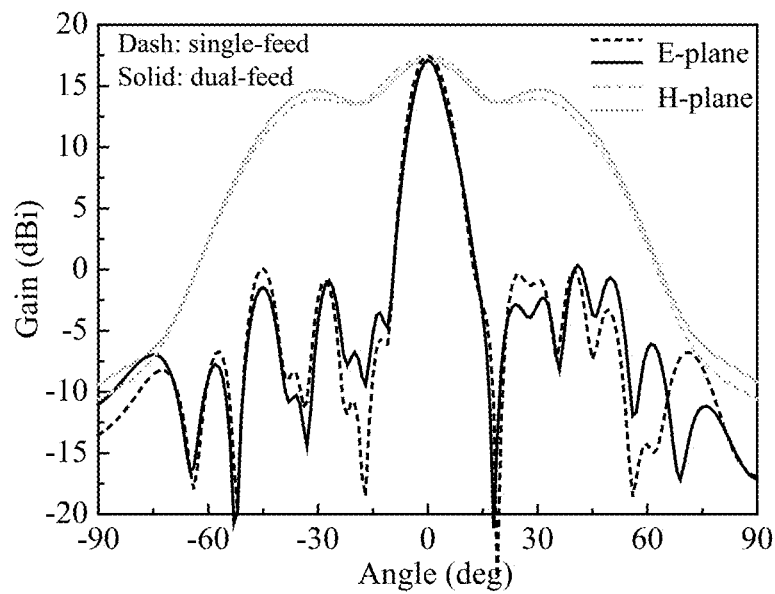
FIG. 11 schematically illustrates comparison of radiation patterns between the antenna based on the SIW single-feed network and the antenna based on the SIW dual-feed network according to an embodiment of the present disclosure.

FIG. 10 schematically illustrates comparison of the antenna based on the SIW single-feed network shown in FIG. 9 and the antenna based on the SIW dual-feed network shown in FIG. 5 in matching and gain, where the antenna and the SIW structure of the two are the same. The single-feed network shown in FIG. 9 requires a large impedance transformation to connect to the input terminals and output terminal, while the multi-feed network does not require a large impedance transformation to connect to the input terminals and output terminals. FIG. 11 schematically illustrates comparison of the two antenna patterns. It can be seen that the matching, gain, and pattern of the antenna of the single-feed and the antenna of the dual-feed networks are almost the same, which indicates that the SIW multi-feed network in this embodiment achieves the power combining function well. Therefore, the antenna of the SIW multi-feed network not only maintains the features of the antenna pattern, beam bandwidth and working bandwidth of the single-feed network, but also realizes a function of power combining.

Figure 12:
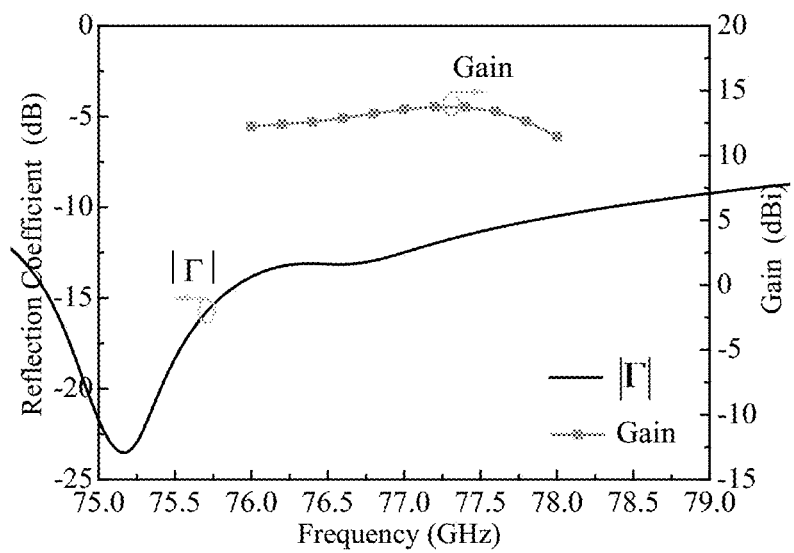
FIG. 12 shows a reflection coefficient and a gain of the chip-package-antenna integrated structure according to an embodiment of the present disclosure.
Figure 13:
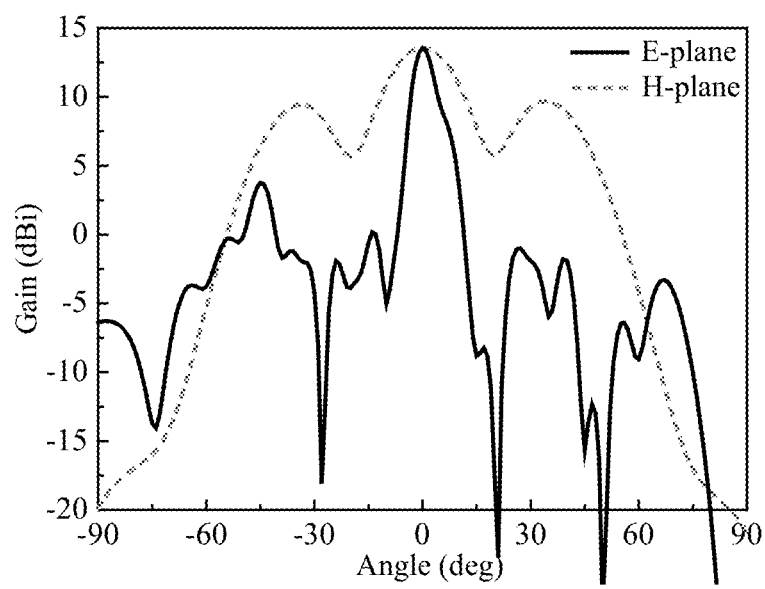
FIG. 13 is a radiation pattern of the chip-package-antenna integrated structure according to an embodiment of the present disclosure.

As shown in FIGS. 12-13, a structure corresponding to FIG. 1 includes a chip, an on-chip transformer, an impedance matching network, an SIW multi-feed network, and an antenna.

FIG. 12 shows a reflection coefficient and a gain of the chip-package-antenna integrated structure in FIG. 1. It can be found from FIG. 12 that a chip-package-antenna integrated design covers 75-78 GHz, and has a desirable gain flatness.

A radiation pattern of the chip-package-antenna integrated structure in FIG. 1 is schematically shown in FIG. 13, from which it can be seen that the maximum radiation direction points to the 0° direction, while the side lobes of the −44.7° pattern experience deterioration. This is mainly because that the high dielectric constant has a certain influence on the pattern, thereby effectively predicting the influence of the chip package on the antenna radiation pattern.

In summary, compared to the prior art, the present disclosure has the following beneficial effects.

(1) The plurality of output terminals of the chip are connected to the SIW multi-feed network through the impedance matching network, to achieve an impedance matching between the chip and the SIW multi-feed network. The output terminal of the SIW multi-feed network is directly connected to the antenna terminals, and two or more input signals experience power combining in the substrate integrated waveguide. Then the combined millimeter-wave signal is radiated by the antenna, finally realizing the power combining in the chip-package-antenna integrated structure. At the same time, the SIW multi-feed network is composed of a SIW structure, in which a plurality of via holes are arranged spaced apart to form a cavity structure, to ensure that the SIW structure is approximately equivalent to the waveguide structure. As a consequence, compared to the traditional planar power divider, the SIW structure in the embodiment has a higher quality factor and larger power capacity, thereby improving the EIRP of the system.

(2) The plurality of output terminals of the chip are connected to the common input terminals of the SIW multi-feed network. The transition between the SIW structure and the plurality of input terminals does not require a large impedance transformation, thus, compared to the traditional power divider, it has a wider working bandwidth. The plurality of input terminals and output terminal of the SIW multi-feed network are all arranged on the same cavity composed of two rows of via holes, effectively reducing the volume and cost of the system.

It should be noted that based on the above description, those of ordinary skill in the art can clearly understand that the above embodiments can be implemented by means of software plus some necessary versatile hardware platforms. In view of this, the above technical solution can be embodied essentially in the form of a software product or the part that contributes to the prior art can be embodied in the form of a software product. The computer software product can be stored in a storage media, such as read-only memory (ROM)/random-access memory (RAM), magnetic discs, and compact discs, etc., and includes several instructions to enable a computer device (such as a personal computer, a server and a network device) to execute the methods described in each embodiment or some parts of the embodiment. As used herein, the terms such as "first" and "second" are only used to distinguish one entity or operation from another entity or operation, and do not necessarily require or imply any actual relationship or order between these entities or operations. Moreover, the terms "include", "comprise" or any other variants thereof are intended to mean the non-exclusive inclusion, and thus a process, method, product or device n not only includes those specified elements, but also includes other elements that are not clearly listed, or those elements inherent to this process, method, product or device. Unless otherwise specified, the element limited by the phrase "including a . . . " does not indicate the exclusion of other identical elements in the process, method, product or device including the element.

The above-mentioned embodiments are merely illustrative of the disclosure, and are not intended to limit this disclosure. It should be understood that changes, modifications and improvements made by those skilled in the art without departing from the spirit of the present disclosure shall fall within the scope of the present disclosure.

What is claimed is:

1. A chip-package-antenna integrated structure based on substrate integrated waveguide (SIW) multi-feed network, comprising:
   a chip;
   an impedance matching network;
   the SIW multi-feed network; and
   an antenna;
   wherein the chip is a packaged chip;
   a plurality of output terminals of the chip are directly connected to a plurality of input terminals of the impedance matching network;
   the impedance matching network is configured to connect the plurality of output terminals of the chip to a plurality of input terminals of the SIW multi-feed network correspondingly, and is further configured for an impedance matching between the chip and the SIW multi-feed network; and
   the SIW multi-feed network is configured for power combining, and the SIW multi-feed network comprises an output terminal connected to the antenna.

2. The chip-package-antenna integrated structure of claim 1, wherein the chip comprises a plurality of on-chip transformers in one-to-one correspondence with transmission channels, and the plurality of on-chip transformers are connected to a pad of the chip.

3. The chip-package-antenna integrated structure of claim 2, wherein the impedance matching network is connected to the pad through ball grid array (BGA), via hole or wire bonding.

4. The chip-package-antenna integrated structure of claim 1, wherein the chip is packaged by flip-chip, fan-out, wire bonding, low temperature co-fired ceramic (LTCC) or high density interconnect (HDI).

5. The chip-package-antenna integrated structure of claim 1, wherein the impedance matching network adopts a grounded coplanar waveguide (GCPW) transmission line.

6. The chip-package-antenna integrated structure of claim 5, wherein a short-circuited stub is provided in a middle of the GCPW transmission line to eliminate a capacitance effect.

7. The chip-package-antenna integrated structure of claim 1, wherein the plurality of input terminals and the output terminal of the SIW multi-feed network are both arranged on a cavity composed of two rows of via holes.

8. The chip-package-antenna integrated structure of claim 1, wherein the antenna is patch antenna, Yagi antenna, dipole antenna, Vivaladi antenna, slot antenna or horn antenna, or an array thereof.

9. The chip-package-antenna integrated structure of claim 1, wherein the impedance matching network, the SIW multi-feed network and the antenna are all arranged on an upper surface of a dielectric slab, and are respectively connected to a metal ground on a lower surface of the dielectric slab through via holes.

* * * * *